(12) United States Patent
Cheng et al.

(10) Patent No.: US 9,153,647 B1
(45) Date of Patent: Oct. 6, 2015

(54) INTEGRATED CIRCUIT HAVING HETEROSTRUCTURE FINFET WITH TUNABLE DEVICE PARAMETERS AND METHOD TO FABRICATE SAME

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/215,123

(22) Filed: Mar. 17, 2014

(51) Int. Cl.
| | |
|---|---|
| *H01L 27/12* | (2006.01) |
| *H01L 29/165* | (2006.01) |
| *H01L 29/78* | (2006.01) |
| *H01L 29/66* | (2006.01) |
| *H01L 21/02* | (2006.01) |

(52) U.S. Cl.
CPC ........ *H01L 29/165* (2013.01); *H01L 21/02532* (2013.01); *H01L 29/66795* (2013.01); *H01L 29/785* (2013.01); *H01L 29/7848* (2013.01); *H01L 29/7851* (2013.01)

(58) Field of Classification Search
CPC .............. H01L 29/165; H01L 29/7851; H01L 29/66795; H01L 29/7848; H01L 29/785; H01L 21/02532
See application file for complete search history.

(56) References Cited

U.S. PATENT DOCUMENTS

| | | | |
|---|---|---|---|
| 6,515,335 B1 | 2/2003 | Christiansen et al. | |
| 6,833,294 B1 | 12/2004 | Mears et al. | |
| 7,202,494 B2 | 4/2007 | Blanchard et al. | |
| 7,514,328 B2 | 4/2009 | Rao | |
| 7,781,827 B2 | 8/2010 | Rao | |
| 8,129,763 B2 | 3/2012 | Bjoerk et al. | |
| 2004/0262681 A1 | 12/2004 | Masuoka et al. | |
| 2013/0161756 A1* | 6/2013 | Glass et al. | 257/369 |

\* cited by examiner

*Primary Examiner* — Shaun Campbell
(74) *Attorney, Agent, or Firm* — Harrington & Smith; Louis J. Percello

(57) ABSTRACT

A field effect transistor (FET) device has a fin disposed over a substrate. The fin has opposing ends defining a source and a drain and intermediate the source and the drain a channel underlying a gate. The fin is formed as a heterostructure having at least one first layer of material and at least one second layer of material that is adjacent to the first layer of material. A thickness of at least one of the first layer of material and the second layer of material is selected to obtain a particular effective device width W. Methods to fabricate the FET device are also described.

20 Claims, 11 Drawing Sheets

US 9,153,647 B1

INTEGRATED CIRCUIT HAVING HETEROSTRUCTURE FINFET WITH TUNABLE DEVICE PARAMETERS AND METHOD TO FABRICATE SAME

TECHNICAL FIELD

The exemplary embodiments of this invention relate generally to semiconductor devices and fabrication techniques and, more specifically, relate to the fabrication of semiconductor transistor devices, such as those used in random access memory (RAM) such as static RAM (SRAM), logic circuitry and input/output (I/O) circuitry.

BACKGROUND

One feature of a heterojunction is that the bandgaps of two adjacent semiconductors are typically different. As a result the energy of the carriers (electrons or holes) that exists at at least one of the band edges must change as the carriers pass through the heterojunction. In most cases the discontinuities exist in both the conduction band and the valence band. In conventional nomenclature, sometimes used with superlattices, if the extrema of both the conduction and valence bands lie in the same layers, the superlattice is referred to as Type I, whereas if the band extrema are found in different layers the superlattice is referred to as Type II.

The FinFET is becoming a main architecture for CMOS technology due to its excellent scalability. However FinFET circuit design is challenging due at least to the discrete values that are available for W (the effective device width). For example, if the fin height is 30 nm and W is equal to two times the height (H) of the fin or 60 nm, and if a circuit designer desires a value of W equal to 90 nm, the circuit designer should either use one fin with W equal to 60 nm or two fins with a total W equal to 120 nm. Moreover the effective device width for various chip blocks such as SRAM and logic are typically similar. It can be appreciated that constraints can be placed on the circuit designer.

SUMMARY

In accordance with a first non-limiting aspect of this invention there is a provided a field effect transistor (FET) device that comprises a fin disposed over a substrate. The fin has opposing ends defining a source and a drain and intermediate the source and the drain a channel underlying a gate. The fin is comprised of a heterostructure comprised of at least one first layer of material and at least one second layer of material that is adjacent to the first layer of material. A thickness of at least one of the first layer of material and the second layer of material is selected to obtain a particular effective device width W.

In accordance with a further non-limiting aspect of this invention there is a provided a method that comprises providing a substrate and forming a fin disposed over the substrate. The fin is formed to have opposing ends defining a source and a drain and intermediate the source and the drain a channel underlying a gate. The fin is formed to comprise a hetero structure comprised of at least one first layer of material and at least one second layer of material that is adjacent to the first layer of material. A thickness of at least one of the first layer of material and the second layer of material is selected to obtain a particular effective device width W.

BRIEF DESCRIPTION OF THE SEVERAL VIEWS OF THE DRAWINGS

FIGS. 1-19 present various enlarged views of semiconductor structures and precursor structures wherein it should be understood that the various layer thicknesses and dimensions are not drawn to scale. More specifically, FIG. 1 shows a multi-layered heterostructure disposed on a bulk silicon or an insulator supporting layer that in turn can be disposed upon an underlying substrate layer.

FIG. 2 illustrates a concept of providing tunable current by thickness engineering of the layers of a heterostructure that forms a fin of a FinFET.

FIG. 3A shows a simplified enlarged top view of an integrated circuit die having three circuit blocks or areas or regions: SRAM, Logic and Other (e.g., I/O), while

FIG. 4 shows an example of materials.

FIG. 5 shows a silicon-on-insulator (SOI) fin embodiment.

FIG. 6 shows a bulk (Si) fin embodiment.

FIGS. 7-12 depict processing steps for fabricating the SOI fin embodiment of FIG. 5, where FIG. 7 depicts an exemplary starting structure as a strained Si directly on insulator (SS-DOI) substrate;

FIG. 8 shows a hardmask formed over a strained Si layer in what will be the SRAM circuit block and a reduction in the thickness of the strained Si layer to form a recess in what will be the Logic circuit block;

FIG. 9 shows a result of removal of a portion of the strained Si layer between the SRAM and Logic circuit blocks and the formation of an isolation structure (STI) between the SRAM and Logic circuit blocks;

FIG. 10 shows a material B epitaxy process whereby a strained-$Si_{1-x}Ge_x$ layer is deposited over the strained Si layer 40 within the recess formed in FIG. 8;

FIG. 11 shows a result of the removal of the hardmask over the SRAM circuit block and the formation of a hardmask over the Logic circuit block; and FIG. 12 shows another material B epitaxy process whereby a strained-$Si_{1-x}Ge_x$ layer is deposited over the strained Si layer in what will be the SRAM circuit block.

FIGS. 13-18 depict processing steps for fabricating the bulk fin embodiment of FIG. 6, where FIG. 13 illustrates a starting structure to be a Si substrate on which is formed a layer of strain-relaxed $Si_{1-y}Ge_y$ over which is deposited a layer of strained-Si followed by a strained-$Si_{1-x}Ge_x$ layer;

FIG. 14 shows a hardmask disposed over the strained-$Si_{1-x}Ge_x$ layer;

FIG. 15 shows a result of fin patterning and the selective removal between the fins of the hardmask, the strained-$Si_{1-x}Ge_x$ layer, the strained-Si layer and a portion of the underlying $Si_{1-y}Ge_y$;

FIG. 16 shows a result of a blanket deposition of an oxide (STI) between the fins defined in FIG. 15 followed by a chemical mechanical polish operation;

FIG. 17 shows a hardmask that is deposited over the SRAM circuit block followed by the removal in the Logic block of the fins previously defined in FIG. 15, thereby forming recesses in the STI; and FIG. 18 illustrates a result of the epitaxial regrowth of the strained-Si layer and the strained-$Si_{1-x}Ge_x$ layer within the recesses to achieve desired heterojunction layer thicknesses for the FinFETS in the Logic circuit block.

FIG. 19 presents a simplified enlarged cross-sectional depiction of a FinFET (e.g., an SRAM FinFET, or a Logic FinFET, or an I/O FinFet) that is constructed in accordance with the various examples of the embodiments of this invention.

DETAILED DESCRIPTION

The challenges facing a circuit designed were outlined above. As a result a 'tunable' FinFET design is preferred. As an example, for a typical SRAM stronger nFETs are required than pFETs. Assuming as a non-limiting case the material choice has similar electron and hole mobilities, the nFETs and pFETs in the logic block can be symmetric (note that this invention is not limited to materials with similar mobilities, since for materials with different mobilities the layer thicknesses can be adjusted accordingly). It is typically desirable for lithography and other process steps that the height of the fins are similar for the different circuitry blocks, e.g., about 30 nm.

As a result, and in accordance with embodiments of this invention, a heterostructure is composed of 2N layers, where N is at least equal to 1. In one non-limiting example the heterostructure contains 10 nm strained SiGe (s-SiGe)/20 nm strained Si (s-Si) for the SRAM block and 15 nm s-SiGe/15 nm s-Si for the logic block, while the total fin height for both the SRAM and logic remains constant, e.g., about 30 nm.

Within a single block, such as SRAM, the pull-up transistor may have a smaller width, and thus a stack of 20 nm s-SiGe/ 10 nm s-Si can be used.

Figure 1:
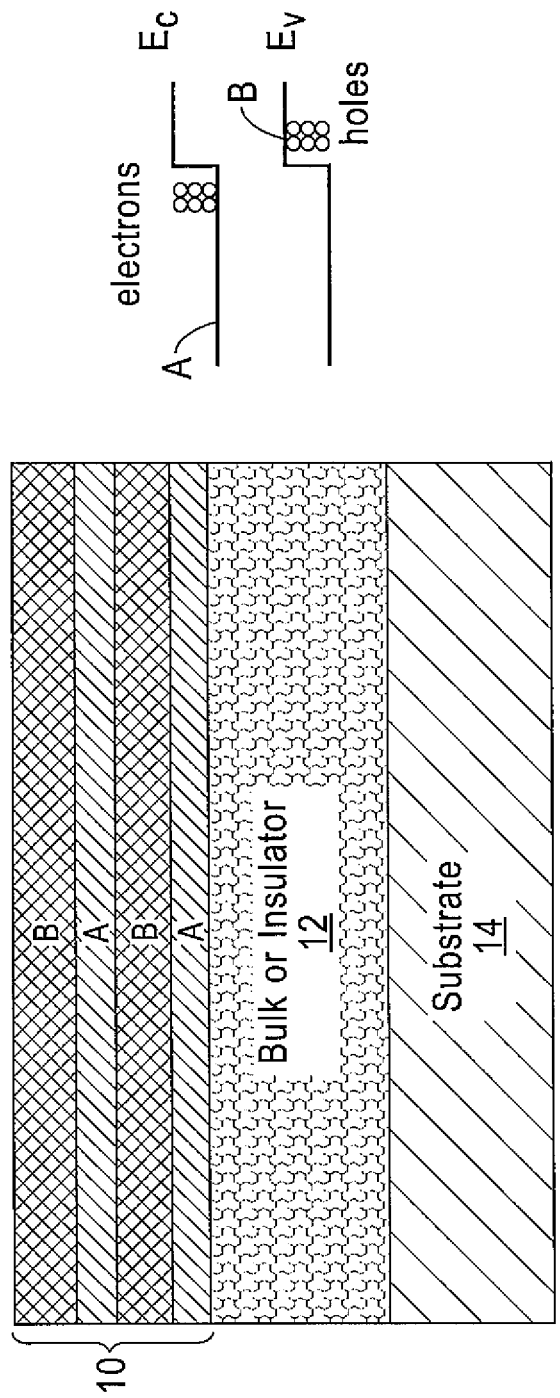

By way of introduction FIG. 1 shows a multi-layered heterostructure 10 disposed on a bulk silicon (Si) or an insulator supporting layer 12 that in turn can be disposed upon an underlying substrate layer 14. Thus in some embodiments a silicon-on-insulator (SOI) structure can be employed, while in other embodiments a bulk structure can be employed. The thicknesses of the layers 12 and 14 can have any desired values.

The heterostructure 10 is composed in this non-limiting example of four layers comprised of two different materials labeled A and B that alternate one with the other. The two materials exhibit a conduction band ($E_c$) and a valence band ($E_v$) where holes 'fall down' in material B while electrons 'fall down' in material A. For example, and for the system shown in FIG. 4, the conduction band forms a quantum mechanical well for electrons, where electrons prefer to populate in material A. Similarly, a quantum mechanical well is formed in the valence band, where holes will preferentially populate in material B.

As non-limiting examples material A can be composed of Si, strained Si or a group III-V material, and material B can be composed of silicon germanium (SiGe), Ge or a group III-V material. The layers A and B have 'tunable' thicknesses as described below.

Figure 2:
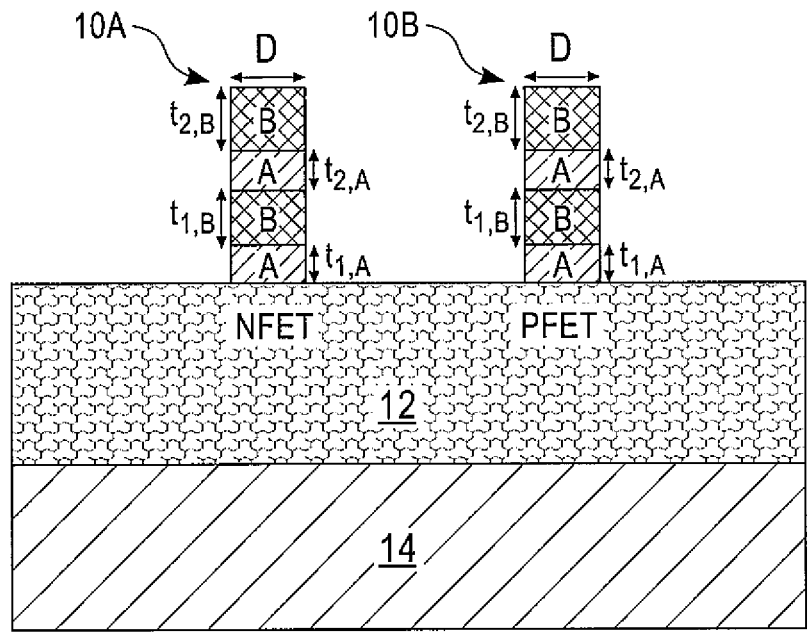

FIG. 2 illustrates the concept of providing tunable current by heterostructure layer thickness engineering and shows an embodiment where two heterostructures 10A and 10B are disposed on the layers 12 and 14. Each of the heterostructures 10A and 10B can be assumed to form a portion of a FinFET device when processing is completed. Each heterostructure 10A and 10B can have a width (D) in an exemplary range of about 2 nm-50 nm with about 5 nm-15 nm being a more preferred range. Shown in FIG. 2 is an nFET embodiment formed in the hetero structure 10A and a pFET embodiment formed in the heterostructure 10B. In each heterostructure the layers A have thicknesses $t_{1A}$ and $t_{2A}$, which can be the same or different, while the layers B have thicknesses $t_{1B}$ and $t_{2B}$, which can be the same or different. For an exemplary double gate (DG) FinFET (possibly having a hardmask layer over the top of the heterostructure), and for the case of an nFET, the current is proportional to $W_N=2\times(t_{1A}+t_{2A})$ (where W is the effective device width), while for the pFET case the current is proportional to $W_P=2\times(t_{1B}+t_{2B})$. The values of $W_N/W_P$ can be adjusted for the circuit application (e.g., SRAM or logic) and can be a non-integer number unlike a conventional Si FinFET. The embodiments of this invention apply as well to tri-gate FinFETS.

The current drive of a MOSFET is directly proportional to its effective width, W, and thus the effective width, W, can be used by a circuit designed to achieve desired device operational characteristics.

More generally, for an n-type FET case device current is proportional to $W=2\times N \times(t_{1A}+t_{2A}, \ldots +t_{NA})$, where N is the number of first layers of material and where $t_{1A}$ is a thickness of one of the first layers of material, where $t_{2A}$ is a thickness of another one of the first layers of material, and where $t_{NA}$ is a thickness of the $N^{th}$ first layer of material. For a p-type FET case device current is proportional to $W=2\times N \times(t_{1B}+ t_{2B}, \ldots +t_{NB})$, where N is the number of second layers of material, where $t_{1B}$ is a thickness of one of the second layers of material, where $t_{2B}$ is a thickness of another one of the second layers of material, and where $t_{NB}$ is a thickness of the $N^{th}$ second layer of material. In general N can be equal to one or more than one.

The aforementioned example for device widths of n-type FETs and p-type FETs is valid for a type II band alignment. While such a band alignment is preferred, this invention is not limited for use with only the type II band alignment. If for a given band (either conduction or valence band), the bands of material A and B align, where no quantum well forms, the above definitions change. For example if a quantum well forms only in the valence band and the conduction band is perfectly aligned, a similar W can be calculated for the p-type FET while for n-type FET, W=2×total fin height.

Figure 3A:
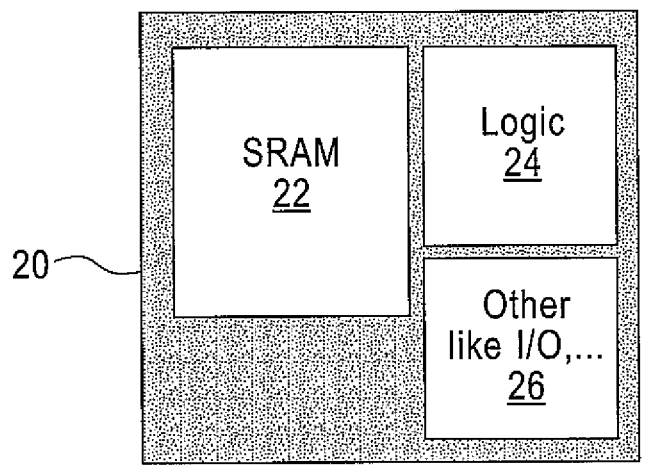
Figure 3B:
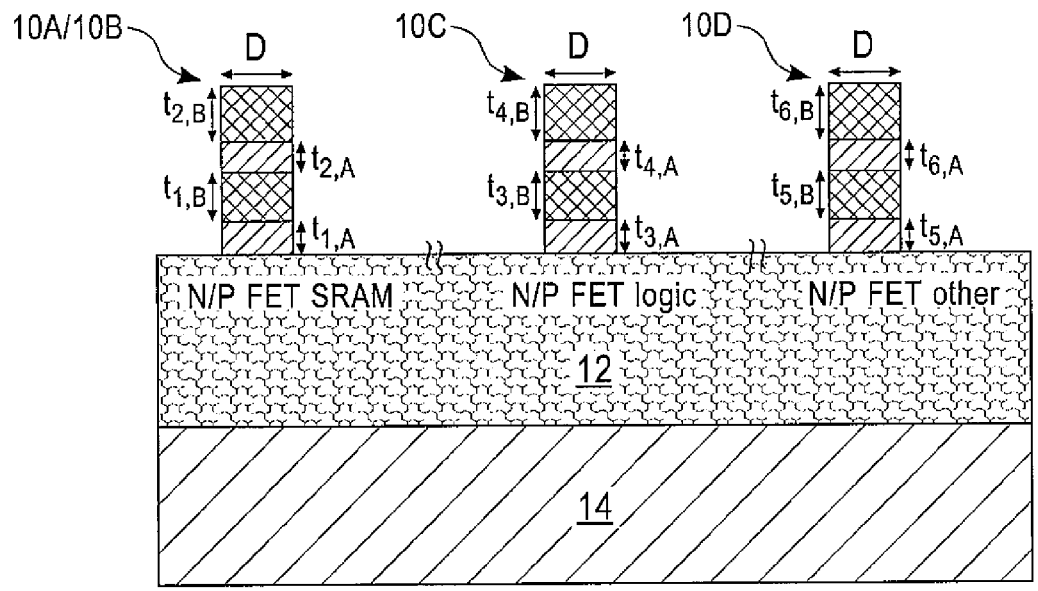
FIG. 3B shows representative heterostructures 10A/10B, 10C and 10D formed in each of the circuit blocks.

FIG. 3A shows a simplified enlarged top view of a non-limiting example of an integrated circuit die having three circuit blocks or areas: SRAM 22, logic 24 and other (e.g., I/O) 26. FIG. 3B shows representative heterostructures 10A/ 10B, 10C and 10D formed in each of the areas. In this embodiment the nFet/pFET SRAM constructed from the heterostructures 10A/10B have layers A with thicknesses $t_{1A}$ and $t_{2A}$, which can be the same or different, and layers B having thicknesses $t_{1B}$ and $t_{2B}$, which can be the same or different. In this embodiment the logic nFet/pFET is constructed from the heterostructure 10C having layers A with thicknesses $t_{3A}$ and $t_{4A}$, which can be the same or different, and layers B having thicknesses $t_{3B}$ and $t_{4B}$, which can be the same or different. In this embodiment the other (e.g., I/O) nFet/pFET is constructed from the hetero structure 10D having layers A with thicknesses $t_{5A}$ and $t_{6A}$, which can be the same or different, and layers B having thicknesses $t_{5B}$ and $t_{6B}$, which can be the same or different.

During fabrication, and in one non-limiting fabrication embodiment, the wafer from which the die 20 is eventually cut could be selectively masked to first epitaxially deposit multiple layers in one region, e.g., the SRAM region 22, the multiple layers A and B with thicknesses $t_{1A}$ and $t_{2A}$ and the layers B having thicknesses $t_{1B}$ and $t_{2B}$, followed by mask stripping and remasking to epitaxially deposit multiple layers in a second region, e.g., the logic region 24, the multiple layers A and B with thicknesses $t_{3A}$ and $t_{4A}$ and the layers B having thicknesses $t_{3B}$ and $t_{4B}$, followed by mask stripping and remasking to epitaxially deposit multiple layers in a third region, e.g., the I/O region 26, the multiple layers A and B with thicknesses $t_{5A}$ and $t_{6A}$ and the layers B having thicknesses $t_{5B}$ and $t_{6B}$. Described below are other more preferred fabrication embodiments.

Figure 4:
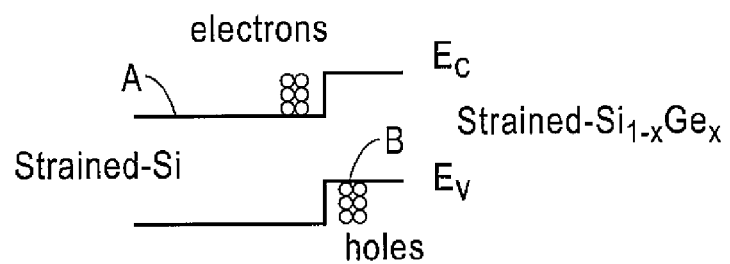

FIG. 4 shows an example of materials. If one assumes as a non-limiting case that a Type II band-alignment is preferred then in this example there can be a strained-Si/strained-Si$_{1-x}$Ge$_x$ stack embodiment where the strained-Si can be latticed matched to the strain relaxed Si$_{1-y}$Ge$_y$ (y=20%), and the strained-Si$_{1-x}$Ge$_x$ can have x=0.4 lattice-matched to the relaxed Si$_{1-y}$Ge$_y$ (y=20%).

Figure 5:
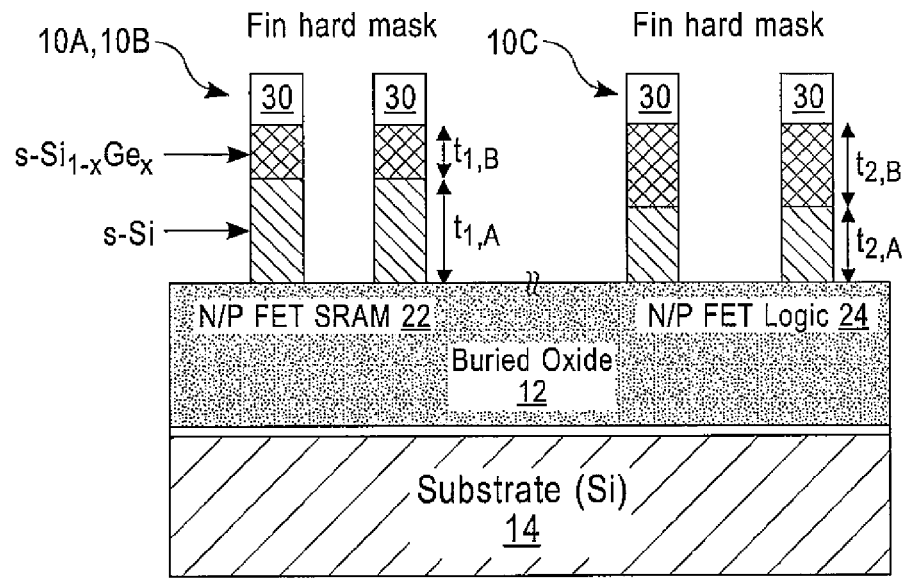

The following description provides two exemplary embodiments of this invention, specifically a SOI embodiment and a bulk (Si) embodiment. FIG. 5 shows the SOI fin embodiment while FIG. 6 shows the bulk fin embodiment.

In the SOI embodiment of FIG. 5 the substrate 14 can be Si and the layer 12 is formed as a layer of buried oxide (BOX). In the N/P FET SRAM block 22 two heterostructures 10A, 10B are shown and in the N/P FET Logic block 24 two of the hetero structures 10C are shown. Each heterostructure (fin) is covered with a fin hard mask 30 (e.g., a layer of silicon nitride). In the heterostructures the s-Si layers A have thicknesses $t_{1,A}$ and $t_{2,A}$ while the strained-$Si_{1-x}Ge_x$ layers B have thicknesses $t_{1,B}$ and $t_{2,B}$. In this example the layers A in the heterostructures 10A, 10B are thicker than the layers A in the heterostructures 10C, while the layers B in the hetero structures 10A, 10B are thinner than the layers B in the heterostructures 10C.

Figure 6:
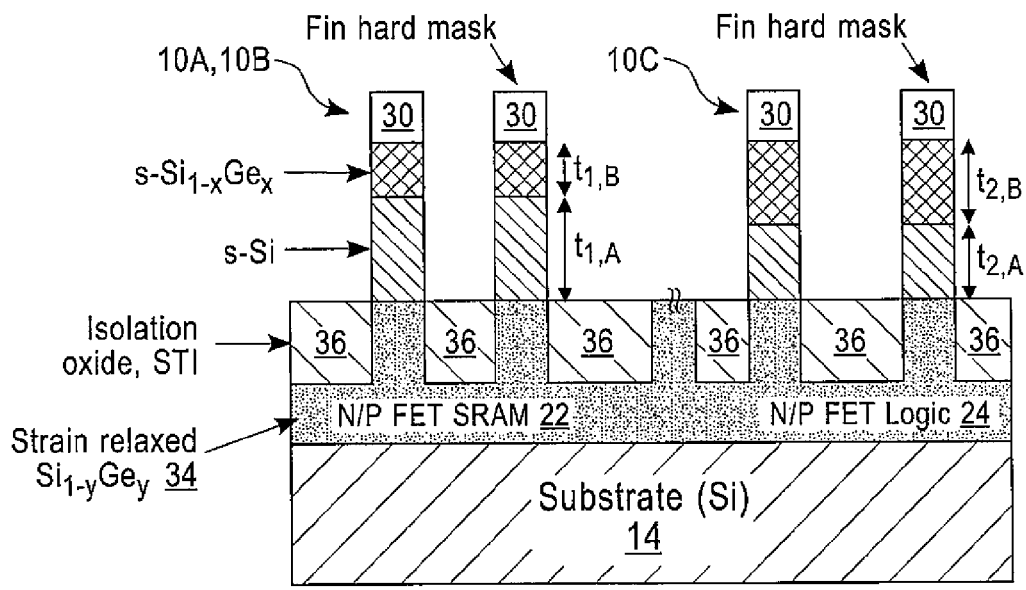

In the bulk embodiment of FIG. 6 the substrate 14 can be Si. Over the substrate 14 is a layer 34 of strain-relaxed $Si_{1-y}Ge_y$. Between the heterostructures 10A, 10B, 10C is formed an isolation oxide as a shallow trench isolation (STI) 36. In the N/P FET SRAM block 22 two heterostructures 10A, 10B are shown and in the N/P FET Logic block 24 two of the heterostructures 10C are shown. Each heterostructure (fin) is covered with the fin hard mask 30. As in the embodiment of FIG. 5 in the heterostructures the s-Si layers A have thicknesses $t_{1,A}$ and $t_{2,A}$ while the strained-$Si_{1-x}Ge_x$ layers B have thicknesses $t_{1,B}$ and $t_{2,B}$. In this example the layers A in the heterostructures 10A, 10B are thicker than the layers A in the heterostructures 10C, while the layers B in the heterostructures 10A, 10B are thinner than the layers B in the heterostructures 10C. The strained Si layers A are disposed on top of the layer 34 of strain-relaxed $Si_{1-y}Ge_y$.

Figure 7:
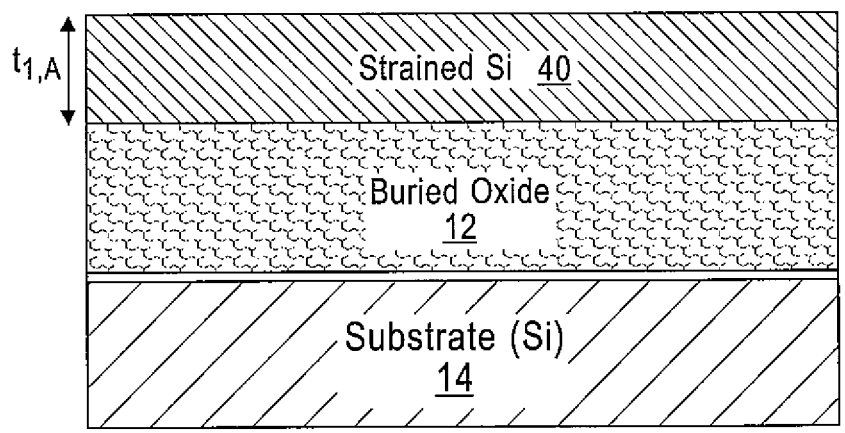

A non-limiting example of process steps for the SOI embodiment of FIG. 5 is now described. Referring to FIG. 7 the starting structure is a strained Si directly on insulator (SSDOI) substrate that can be formed, for example, by transferring strained silicon 40 grown epitaxially on relaxed silicon germanium (SiGe) to the buried oxide layer 12. The SiGe layer is then removed.

Figure 8:
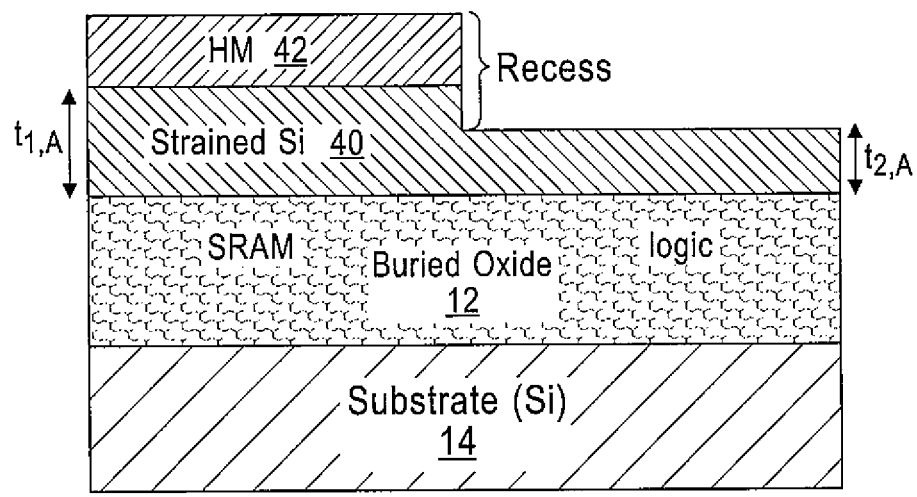

In FIG. 8 a hardmask 42 is formed over the strained Si layer 40 in what will be the SRAM circuit block 22 and the thickness of the strained Si layer 40 is thinned or reduced to a value $t_{2,A}$ in what will be the Logic block 24. The result is the formation of a recess in what will be the Logic block 24. The thinning of the strained Si layer 40 can be accomplished by any suitable process such as a wet chemical etch or by a reactive ion etch (RIE) process.

Figure 9:
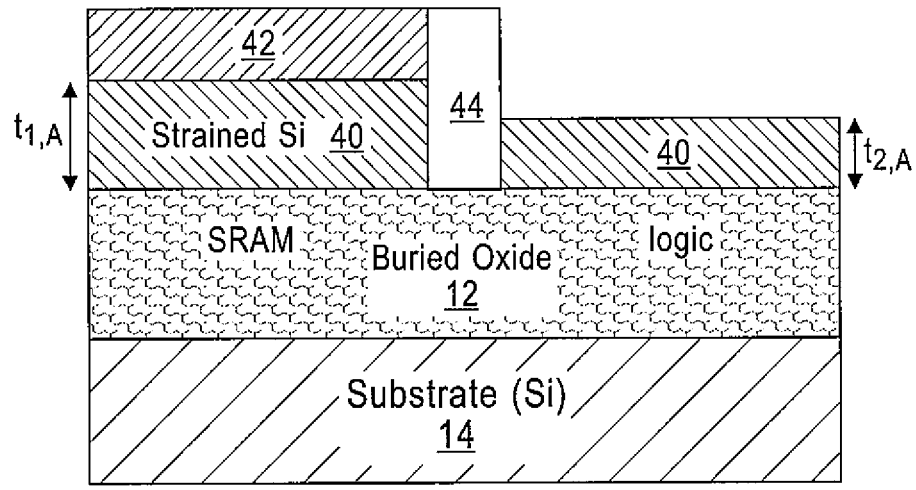

FIG. 9 shows a result of removal of a portion of the strained Si layer 40 between the SRAM and Logic blocks 22, 24 and the formation of an isolation structure (STI) 44 between the SRAM and Logic blocks 22, 24.

Figure 10:
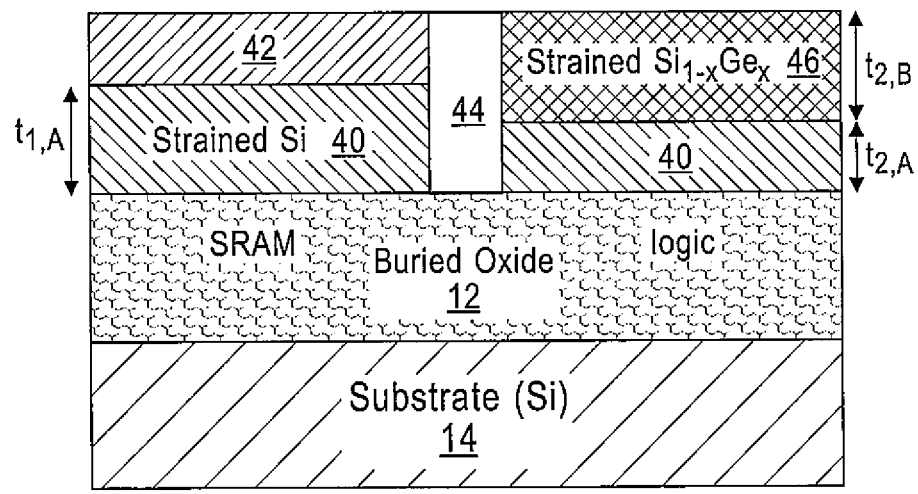

FIG. 10 shows a material B epitaxy process whereby a strained-$Si_{1-x}Ge_x$ layer 46 is deposited over the strained Si layer 40 in the recess formed in what will be the Logic block 24. The strained-$Si_{1-x}Ge_x$ layer 46 has the thickness $t_{2,B}$ as shown in FIG. 5.

The epitaxy process used for the step in FIG. 10 and other steps can be any conventional type of epitaxial process such as molecular beam epitaxy (MBE) or chemical vapor deposition (CVD) as two non-limiting examples.

Figure 11:
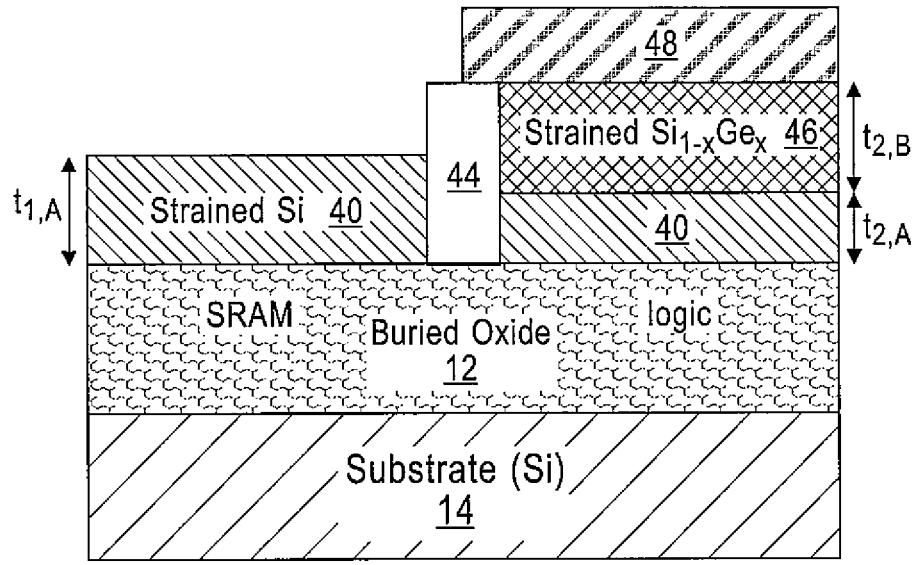

FIG. 11 shows a result of the removal of the hardmask 42 over the SRAM circuit block 22 and the formation of a hardmask 48 over the Logic circuit block 24.

Figure 12:
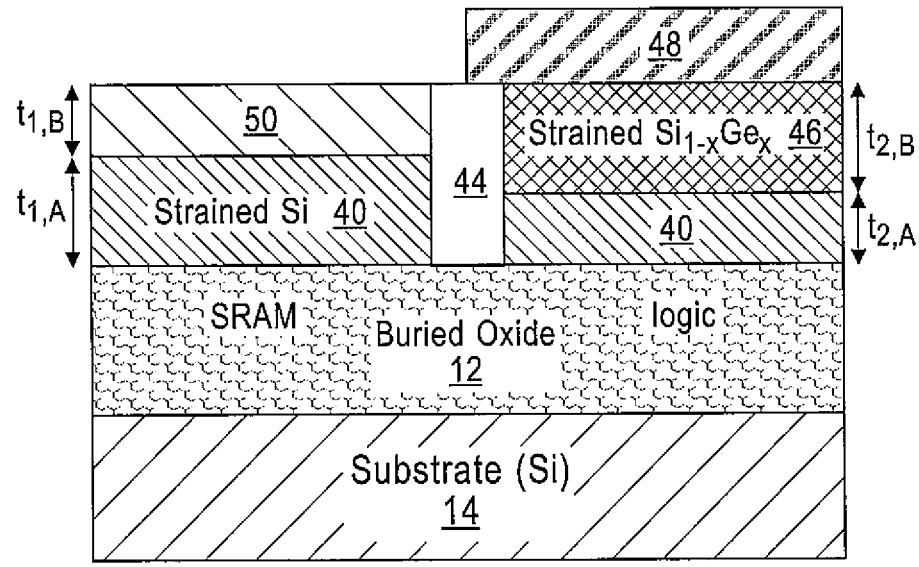

FIG. 12 shows another material B epitaxy process whereby a strained-$Si_{1-x}Ge_x$ layer 50 is deposited over the strained Si layer 40 in what will be the SRAM block 22. The strained-$Si_{1-x}Ge_x$ layer 50 has the thickness $t_{1,B}$ as shown in FIG. 5.

At this point the intermediate structure formed thus far is further processed to remove the hardmask 48 and to define the heterostructure fins 10A, 10B, 10C from the layers 40, 46 and 50 as shown in FIG. 5, followed by conventional processing in order to form doped source/drains (S/D), S/D contacts, gate dielectric and gate metal and gate contacts on the resulting fins (e.g., see FIG. 19 discussed below). Note that in this embodiment the channel of the FinFET underlying the gate is a hetero structure which has tunable design parameters for logic, SRAM, I/O, etc, FinFETS by having different heterostructure layer thicknesses.

Figure 13:
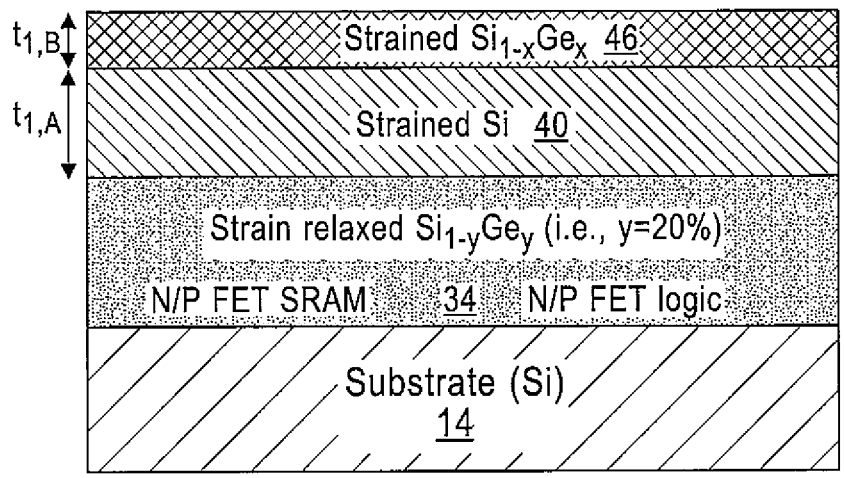

A non-limiting example of process steps for the bulk embodiment of FIG. 6 is now described. Referring to FIG. 13 the starting structure is the Si substrate 14 on which is formed the layer 34 of strain-relaxed $Si_{1-y}Ge_y$ over which is deposited the layer of strained-Si 40 to a thickness $t_{1,A}$ followed by the strained-$Si_{1-x}Ge_x$ layer 46 to a thickness $t_{1,B}$. The strained Si layer 40 (material A) is lattice matched to the $Si_{1-y}Ge_y$ layer 34. Note that at this point the thicknesses of the layers of strained-Si 40 and strained-$Si_{1-x}Ge_x$ 46 correspond to those desired for the FinFETs in the SRAM circuit block 22. The thicknesses of these layers for the Logic circuit block 24 are adjusted in the processing shown in FIGS. 17 and 18.

Figure 14:
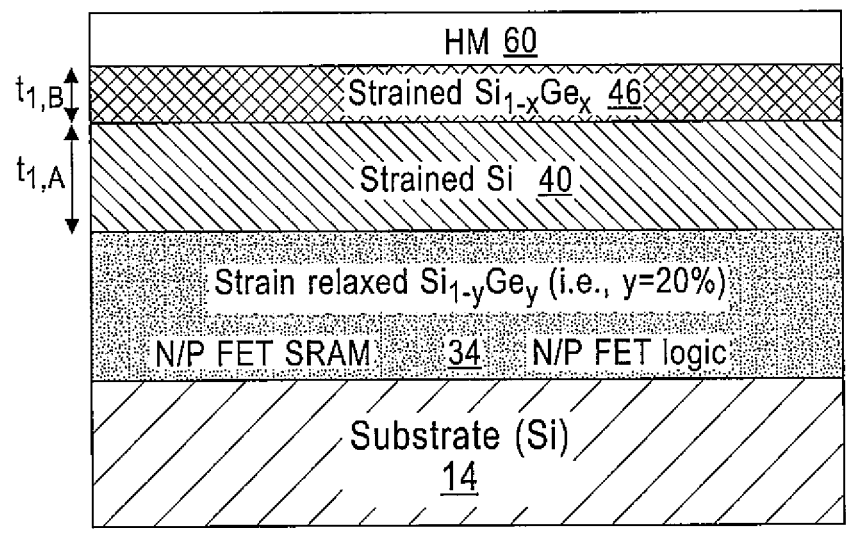

FIG. 14 shows the result of depositing a hardmask (HM) 60 over the strained-$Si_{1-x}Ge_x$ layer 46.

Figure 15:
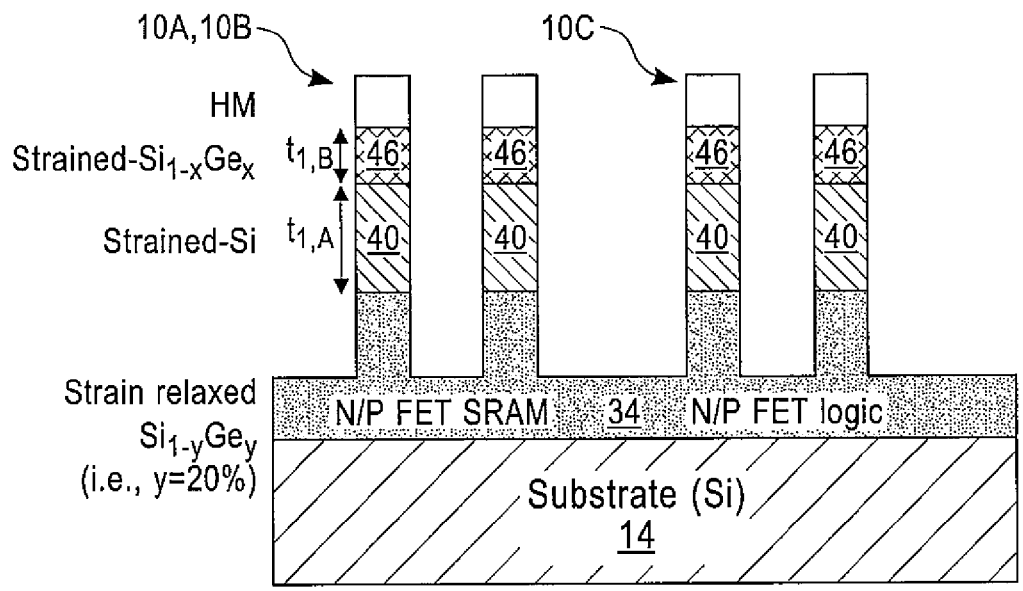

FIG. 15 shows the result of fin patterning and selective removal between the fins 10A, 10B, 10C of the HM 60, the strained-$Si_{1-x}Ge_x$ layer 46, the strained-Si layer 40 and a portion of the underlying $Si_{1-y}Ge_y$ layer 34.

Figure 16:
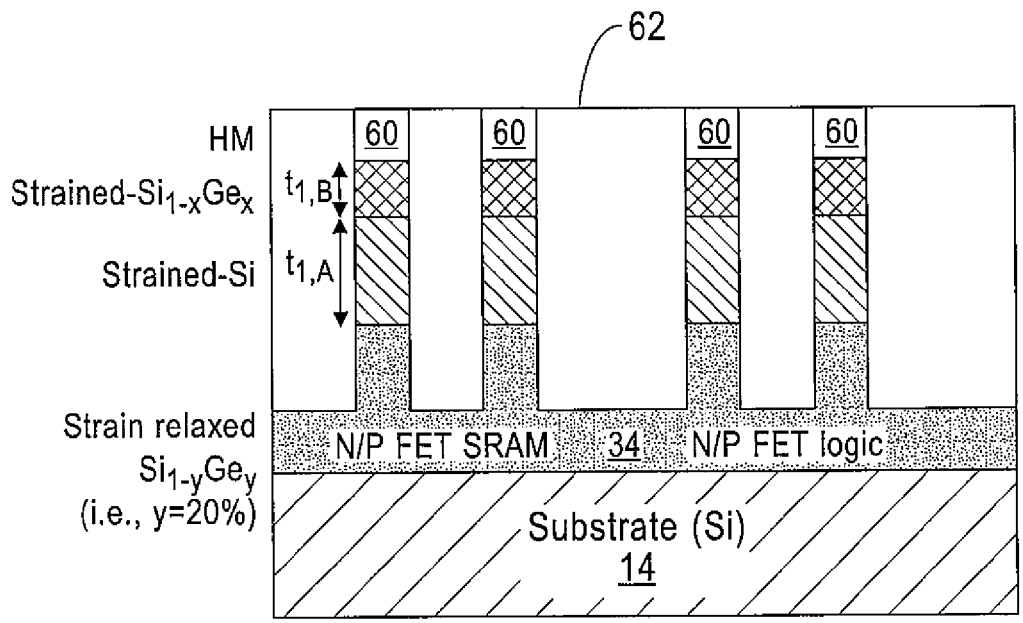

FIG. 16 shows a result of blanket deposition of a dielectric material such as an oxide (STI) 62 between the fins defined in FIG. 15 followed by a chemical mechanical polish (CMP) that planarizes the STI 62 and stops on the HM 60. The dielectric material can be seen to embed the heterostructures.

Figure 17:
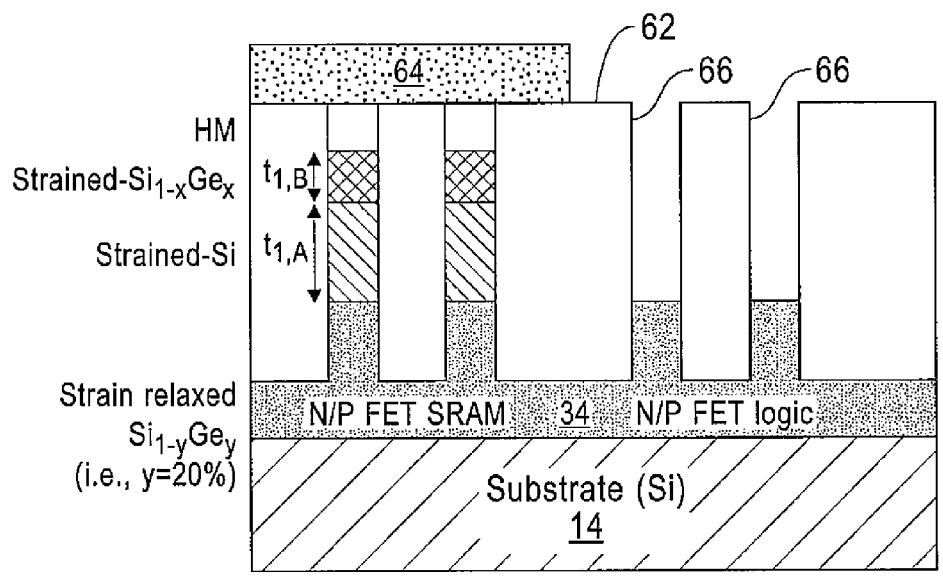

FIG. 17 shows a HM 64 that is deposited over the SRAM circuit block 22, followed by the removal in the Logic block 24 region of the fins previously defined in FIG. 15. In this step the HM 60, the strained-$Si_{1-x}Ge_x$ layer 46 and the strained-Si layer 40 are removed thus forming openings or recesses 66 in the Logic block 24 region that expose the underling portions of the layer 34 of strain-relaxed $Si_{1-y}Ge_y$.

Figure 18:
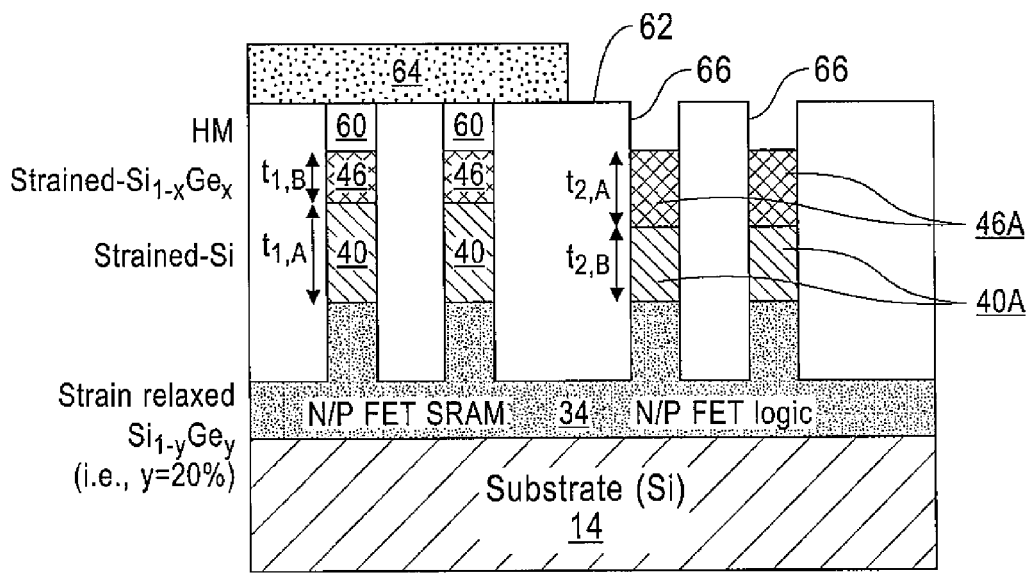

FIG. 18 shows a result of the epitaxial regrowth of the strained-Si layer 40 (designated 40A) and the strained-$Si_{1-x}Ge_x$ layer 46 (designated 46A) within the recesses. The epitaxial regrowth is performed to achieve the desired thicknesses $t_{2,A}$ and $t_{2,B}$ for the FinFETS in the Logic circuit block 24.

At this point the intermediate structure formed thus far is further processed to remove the hardmask 64, to recess the STI 62 down to the level of the layer 34 of strain-relaxed $Si_{1-y}Ge_y$, to form the HMs 30 and to define the heterostructure fins 10A, 10B, 10C from the layers 40, 40A, 46, 46A to result in the structure shown in FIG. 6. This is followed by conventional processing in order to form source/drains (S/D), S/D contacts, gate dielectric and gate metal and gate contacts on the resulting fins. It can be noted as well that in this embodiment the channel of the FinFET underlying the gate is a heterostructure which has tunable design parameters for logic, SRAM, I/O, etc, FinFETS by having different heterostructure layer thicknesses.

Figure 19:
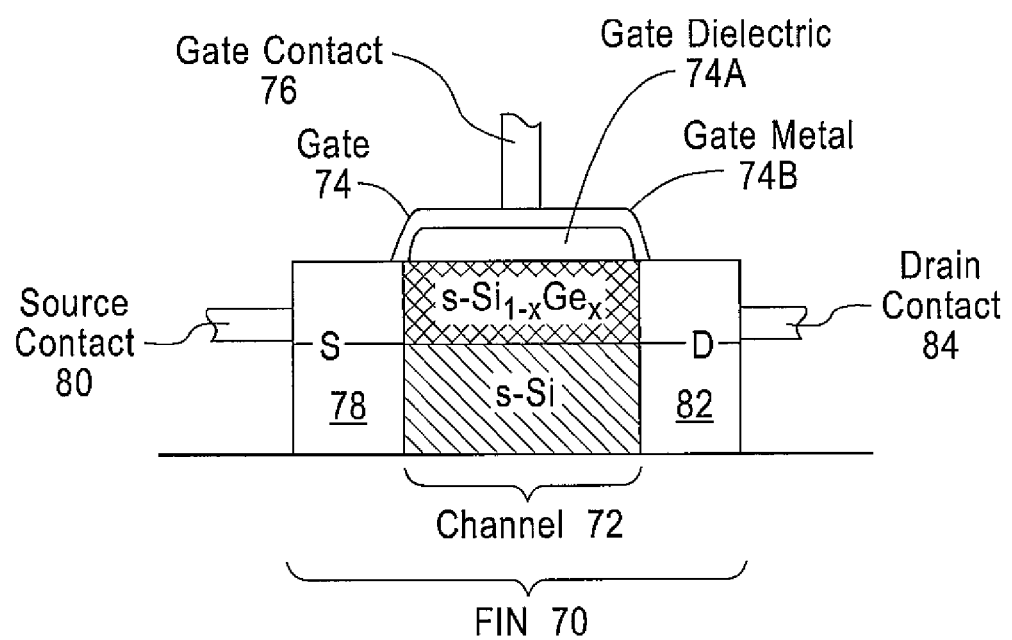

Further in this regard, FIG. 19 presents a simplified enlarged lengthwise cross-sectional view of a FinFET (e.g., an SRAM FinFET, or a Logic FinFET, or an I/O FinFet). The FinFET includes a fin 70 containing a channel 72. The channel 72 is disposed beneath a gate 74 that is comprised of a gate dielectric layer 74A (e.g., a high-k layer) and a gate metal layer 74B. Connected to the gate 74 is a gate contact 76. At opposing ends of the fin 70 is a source (S) 78 connected with a source contact 80 and drain (D) connected with a drain contact 84. The S and D regions are doped appropriately depending on whether the FinFET is a pFET or an nFET. The channel includes at least two material layers that can be the strained-Si/strained-Si$_{1-x}$Ge$_x$ layers described above, where each layer has a thickness (e.g., $t_{1,A}$, $t_{1,B}$) selected to provide the desired operating characteristics for the device. For the bulk embodiment shown in FIGS. 6 and 13-18 the strain-relaxed Si$_{1-y}$Ge$_y$ layer 34 can be present within or beneath the fin 70. The embodiments of FIGS. 2 and 3B can also be employed where there are two or more layers of each of the strained-Si/strained-Si$_{1-x}$Ge$_x$ in each fin 70. Further, and as was noted above, in some embodiments it may be desirable to employ Group III-V materials in the various layers of the fin 70.

It is to be understood that the exemplary embodiments discussed above with reference to FIGS. 1-19 can be used on common variants of the FET device including, e.g., FET devices with multi-fingered FIN and/or gate structures and FET devices of varying gate width and length.

In accordance with the various exemplary embodiments of this invention described above the band structure of the constituent materials need not be altered, instead heterostructures are provided in which, by selecting materials, electrons fall in one layer and holes in the other layer. As a result a high mobility material can be used for each charge carrier separately in conjunction with adjusting the height (thickness) of each material in such as manner as to obtain a desired effective width for a particular type of circuit design. Different thicknesses of materials for nFET, pFET, logic, SRAM, etc., FinFETS are achieved by epitaxial layer deposition.

In accordance with the various exemplary embodiments of this invention described above a FinFET structure is provided with different materials for electron and hole mobility enhancement, where bands are aligned in a such a manner that only one semiconductor type confines only one type of charge carrier. With tunable parameters such as mobility and thickness of the layers for nFET, pFET, logic, SRAM and I/O types of devices a freedom of design is provided to the circuit designer, as opposed to conventional practice of simply varying the number of fins for a single channel FinFET, particularly in those cases where a maximum fin height is constrained across the die based on topological and other considerations.

Integrated circuit dies can be fabricated with various devices such as a field-effect transistors, bipolar transistors, metal-oxide-semiconductor transistors, diodes, resistors, capacitors, inductors, etc., that also have FinFETS that are formed using the methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, layer thicknesses and the like that were specifically disclosed above. Any and all such and similar modifications of the teachings of this invention will still fall within the scope of this invention.

What is claimed is:

1. A semiconductor structure, comprising:
a plurality of devices disposed over a substrate, the plurality of devices being comprised of at least two field effect transistors (FETs) comprising an n-type FET (nFET) device and a p-type FET (pFET) device;
where the nFET and the pFET each have the same channel material stacks each comprised of a heterostructure, the heterostructure being comprised of at least one first layer of semiconductor material (A) having a thickness (tA) and at least one second layer of semiconductor material (B) having a thickness (tB), where the second layer of semiconductor material is adjacent to the first layer of semiconductor material and is different from the first layer of semiconductor material;
where for the nFET device current flow is proportional to tA and for the pFET device current flow is proportional to tB, and where an effective device width (W) of the nFET device is a function of tA and the effective device width of the pFET device is a function of tB.

2. The semiconductor structure of claim 1, where for the n-type FET device current is proportional to $W=2\times N\times(t_{1,A}+t_{2,A}, \ldots +t_{N,A})$, where N is the number of first layers of semiconductor material and where $t_{1,A}$ is a thickness of one of the first layers of semiconductor material, where $t_{2,A}$ is a thickness of another one of the first layers of semiconductor material, and where $t_{N,A}$ is a thickness of the $N^{th}$ first layer of semiconductor material.

3. The semiconductor structure of claim 1, where for the p-type FET device current is proportional to $W=2\times N\times(t_{1,B}+t_{2,B}, \ldots +t_{N,B})$, where N is the number of second layers of semiconductor material, where $t_{1B}$ is a thickness of one of the second layers of semiconductor material, where $t_{2B}$ is a thickness of another one of the second layers of semiconductor material, and where $t_{NB}$ is a thickness of the $N^{th}$ second layer of semiconductor material.

4. The semiconductor structure of claim 1, where the first layer of semiconductor material is comprised of strained Si and where the second layer of semiconductor material is comprised of strained-$Si_{1-x}Ge_x$.

5. The semiconductor structure of claim 4, where the substrate is comprised of a bulk Si substrate, and where said first layer of strained Si overlies a layer comprised of strain-relaxed $Si_{1-y}Ge_y$ disposed between said first layer and a surface of said bulk Si substrate.

6. The semiconductor structure of claim 4, where the substrate is comprised of a strained Si directly on insulator (SSDOI) substrate that provides said first layer of strained Si.

7. The semiconductor structure of claim 1, where the nFET channel material stack is contained within a first Fin structure and the pFET channel material stack is contained within a second Fin structure, and where a total thickness of the nFET channel material stack is approximately equal to a total thickness of the nFET channel material stack, and where the effective width of the nFET device is different than the effective device width of the pFET device.

8. The semiconductor structure of claim 7, where the plurality of devices are used in a memory circuit, where another plurality of devices are used in a logic circuit, and where still another plurality of devices are used in an input/output (I/O) circuit, and where all of the plurality of devices are disposed over the same substrate.

9. The semiconductor structure of claim 1, where said substrate comprises a layer of dielectric material and where said first layer is disposed on the layer of dielectric material.

10. A method to fabricate a field effect transistor (FET) device comprising:
providing a substrate; and
forming over the substrate a plurality of devices comprised of at least two field effect transistors (FETs) comprising an n-type FET (nFET) device and a p-type FET (pFET) device, where the nFET and the pFET are formed to each have the same channel material stacks each comprised of a heterostructure, the heterostructure being comprised of at least one first layer of semiconductor material (A) having a thickness (tA) and at least one second layer of semiconductor material (B) having a thickness (tB), where the second layer of semiconductor material is adjacent to the first layer of semiconductor material and is different from the first layer of semiconductor material;
where for the nFET device current flow is proportional to tA and for the pFET device current flow is proportional to tB, and where an effective device width (W) of the nFET device is a function of tA and the effective device width of the pFET device is a function of tB.

11. The method of claim 10, where for the n-type FET device current is proportional to $W=2 \times N \times (t_{1A}+t_{2A}, \ldots +t_{NA})$, where N is the number of first layers of semiconductor material and where $t_{1A}$ is a thickness of one of the first layers of semiconductor material, where $t_{2A}$ is a thickness of another one of the first layers of semiconductor material, and where $t_{NA}$ is a thickness of the $N^{th}$ first layer of semiconductor material.

12. The method of claim 10, where for the p-type FET device current is proportional to $W=2 \times N \times (t_{1B}+t_{2B}, \ldots +t_{NB})$, where N is the number of second layers of semiconductor material, where $t_{1B}$ is a thickness of one of the second layers of semiconductor material, where $t_{2B}$ is a thickness of another one of the second layers of semiconductor material, and where $t_{NB}$ is a thickness of the $N^{th}$ second layer of semiconductor material.

13. The method of claim 10, where the first layer of semiconductor material is comprised of strained Si and where the second layer of semiconductor material is comprised of strained-$Si_{1-x}Ge_x$.

14. The method of claim 13, where the substrate is provided to be comprised of a bulk Si substrate, and where said first layer of strained Si overlies a layer comprised of strain-relaxed $Si_{1-y}Ge_y$ disposed between said first layer of strained Si and a surface of said bulk Si substrate.

15. The method of claim 13, where the substrate is comprised of a strained Si directly on insulator (SSDOI) substrate that provides said first layer of strained Si.

16. The method of claim 10, where the nFET channel material stack is contained within a first fin and the pFET channel material stack is contained within a second fin, and where a total thickness of the nFET channel material stack is approximately equal to a total thickness of the nFET channel material stack, and where the effective width of the nFET device is different than the effective device width of the pFET device and is selected to obtain the particular effective device width W depending on a type of FET device in which the fin is incorporated, where one type of FET device is used in a memory circuit, where another type of FET device is used in a logic circuit, and where a third type of FET device is used in an input/output (I/O) circuit.

17. A method to fabricate a field effect transistor (FET) device comprising:
providing a substrate; and
forming a fin disposed over the substrate, the fin having opposing ends defining a source and a drain and intermediate the source and the drain a channel underlying a gate, the fin being formed to comprise a heterostructure comprised of at least one first layer of material and at least one second layer of material that is adjacent to the first layer of material, where a thickness of at least one of the first layer of material and the second layer of material is selected to obtain a particular effective device width W;
where the substrate is provided to be comprised of a bulk Si substrate, where said first layer of material is disposed on a layer of strain-relaxed material that is disposed over a surface of the substrate, and where the method further comprises:
forming a first fin and a second fin each comprising part of the strain-relaxed material layer, the first layer of material and the second layer of material;
embedding the first fin and the second fin in a layer of dielectric material;
removing the first layer of material and the second layer of material from the second fin to form an opening in the layer of dielectric material that exposes an underlying portion of the strain-relaxed material layer; and
depositing a new first layer of material and a new second layer of material into the opening, where a thickness of at least one of the new first layer of material and the new second layer of material differs from a thickness of the first layer of material and the second layer of material of the first fin.

18. The method of claim 17, where the first layer of material is comprised of strained Si, where the second layer of material is comprised of strained-$Si_{1-x}Ge_x$, and where the layer of strain-relaxed material is comprised of $Si_{1-y}Ge_y$.

19. The method of claim 10, where the substrate is comprised of a silicon-on-insulator (SOI) substrate having a silicon layer overlying a buried oxide layer, where the first layer of semiconductor material comprises the silicon layer, and where the method further comprises:

applying a mask to a first portion of the first layer of semiconductor material;

thinning an unmasked second portion of the first layer of semiconductor material;

depositing the second layer of semiconductor material over the thinned second portion of the first layer of semiconductor material;

masking the deposited second layer of semiconductor material over the thinned second portion of the first layer of semiconductor material;

removing the mask from the first portion of the first layer of semiconductor material and depositing the second layer of semiconductor material over the first portion of the first layer of semiconductor material; and forming a first fin and a second fin having approximately equal thicknesses, where the first fin comprises the first portion of the first layer of semiconductor material and the overlying second layer of semiconductor material, and where the second fin comprises the thinned second portion of the first layer of semiconductor material and the overlying second layer of semiconductor material.

20. The method of claim 19, where the first layer of semiconductor material is comprised of strained Si and where the second layer of semiconductor material is comprised of strained-$Si_{1-x}Ge_x$.

* * * * *